United States Patent
Ko

(10) Patent No.: US 10,488,446 B2
(45) Date of Patent: Nov. 26, 2019

(54) POWER DETECTOR

(71) Applicant: FCI Inc., Seongnam-si (KR)

(72) Inventor: DongHyun Ko, Sungnam (KR)

(73) Assignee: FCI INC., Gyeonggi-Do (KR)

(*) Notice: Subject to any disclaimer, the term of this patent is extended or adjusted under 35 U.S.C. 154(b) by 416 days.

(21) Appl. No.: 15/438,554

(22) Filed: Feb. 21, 2017

(65) Prior Publication Data

US 2018/0238941 A1    Aug. 23, 2018

(51) Int. Cl.
*G01R 21/133* (2006.01)
*G01R 35/00* (2006.01)

(52) U.S. Cl.
CPC ......... *G01R 21/133* (2013.01); *G01R 35/005* (2013.01)

(58) Field of Classification Search
CPC ........ G01R 19/02; G01R 19/04; G01R 19/32; G01R 35/00; G01R 35/005; G01R 21/10; G01R 21/133; H03K 5/1532; H03K 5/1536; H03K 5/22; H03K 5/2409; H03K 5/2418; H03K 5/2435; H03G 3/20
See application file for complete search history.

(56) References Cited

U.S. PATENT DOCUMENTS

| | | | | |
|---|---|---|---|---|
| 4,703,251 | A | * 10/1987 | Baumgartner | G01S 7/52003 324/601 |
| 2007/0030064 | A1 | * 2/2007 | Yu | G01R 21/10 330/140 |
| 2008/0139145 | A1 | * 6/2008 | Behzad | H03F 3/45183 455/127.1 |
| 2012/0105033 | A1 | * 5/2012 | Tateishi | G01J 1/44 323/272 |

* cited by examiner

*Primary Examiner* — Son T Le
(74) *Attorney, Agent, or Firm* — Muncy, Geissler, Olds & Lowe, P.C.

(57) ABSTRACT

Disclosed is a power detector. The power detector in which calibration is performed to minimize errors caused by a process variation and a temperature variation in a structure that allows a wide input dynamic range of the power detector at a low supply voltage is provided.

13 Claims, 8 Drawing Sheets

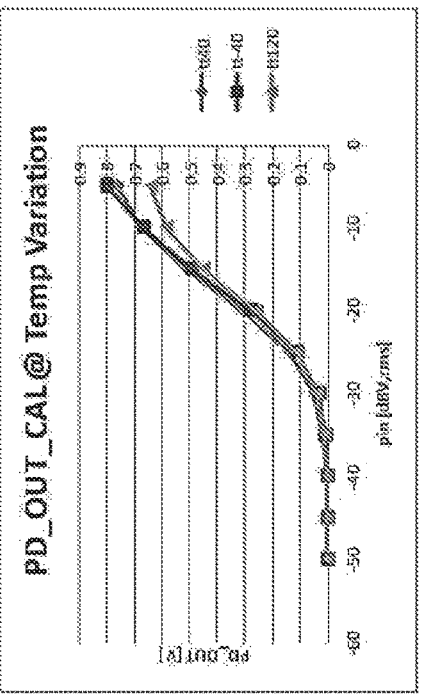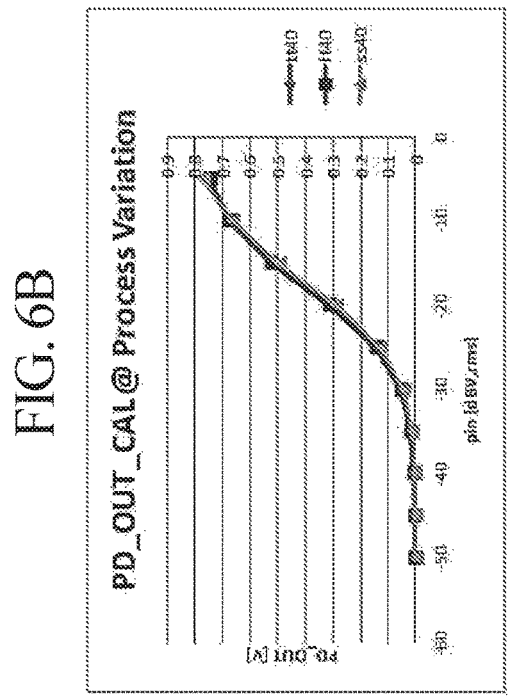
FIG. 6A  FIG. 6B  FIG. 6C  FIG. 6D

POWER DETECTOR

BACKGROUND OF THE INVENTION

Field of Invention

The present invention relates to a power detector in which calibration is performed to minimize errors caused by a process variation and a temperature variation in a low supply voltage ($V_{DD}$).

Description of Prior Art

Contents described below provide only background information related to embodiments of the present invention and do not describe the related art.

A conventional power detector (PD) illustrated in FIG. 1 serves to convert a voltage into a current domain in a first N-type amplifier ($MN_1$) and a second N-type amplifier ($MN_2$). The conventional PD may serve as a rectifier after combining two output currents of a first N-type amplifier ($MN_1$) and a second N-type amplifier ($MN_2$) in a first P-type amplifier ($MP_1$). The conventional PD serves to apply an output thereof to a second P-type amplifier ($MP_2$) and convert the output into a voltage domain using a first resistor ($R_1$). Since an undesired high-frequency component still exists on a node when the PD converts the output into the voltage domain, the PD removes frequency components other than a direct current (DC) component using a resistive-capacitive (RC) low pass filter. Since an area of a capacitor is generally large in a complementary metal-oxide-semiconductor (CMOS) process when an RC filter is manufactured, the PD reduces an RC pole by increasing a size of a second resistor ($R_2$). For example, a value of the first resistor ($R_1$) may range from 500 kΩ to several MΩ.

A peak detector, a root-mean square (RMS) detector, or the like is used in a concept similar to the conventional PD. A main function of the PD is to minimize errors caused between an input and an output thereof when power or a peak voltage applied to the input is converted into a DC output voltage. In the PD, since a PD output value (PD_OUT) varies sensitively according to a process variation and a temperature variation, it is an important factor to control the PD output value (PD_OUT) in the PD. In the case of a peak detector, feed-back is performed so that a gain of a main amplifier of a PD becomes 1.

The peak detector charges electric charges to a capacitor while a signal is looking for a positive (+) peak by implementing a capacitor and a diode in an output node of the PD. The peak detector is fed back to have a structure in which a peak voltage value is found by reducing a rate at which the electric charges are discharged by the capacitor while the signal is looking for a negative (−) peak. Due to the above-described feedback structure, there is an advantage in that the peak detector may operate insensitive to the process variation and the temperature variation.

However, the peak detector has a structure in which it is difficult to infer the performance of the amplifier when being used in a range from several hundred MHz to several GHz and is difficult to have a wide input dynamic range at a low supply voltage ($V_{DD}$). For example, when a supply voltage ($V_{DD}$) of 1.2 V is used in the peak detector, the PD output value (PD_OUT) is limited to 400 mV within a range from 0.6 V to 1 V.

An RMS detector or a PD has a structure in which an input voltage is converted into a current interface using a metal-oxide-semiconductor (MOS), the current interface is rectified, and a PD output value (PD_OUT) of the voltage interface is then generated again using a resistor. Since the RMS detector or the PD processes in an input voltage current domain, there is an advantage in that the RMS detector or the PD operates at a high frequency. In the RMS detector or the PD, a restriction of 0.6 V for determining a minimum (MIN) voltage level of the PD output value (PD_OUT) for operating an amplifier of the above-described supply voltage ($V_{DD}$) of 1.2 V disappears. Therefore, it is advantageous in that the RMS detector or the PD has a wide input dynamic range. However, since the RMS detector or the PD is sensitive to a GM variation of the input MOS transistor, it is difficult to ignore a temperature variation. Since resistance in a process of converting into a voltage domain by a resistor after rectification is changed by about ±15% in a CMOS process, a chip variation problem may occur.

SUMMARY OF THE INVENTION

The present invention is directed to a power detector (PD) in which calibration is performed to minimize errors caused by a process variation and a temperature variation in a structure that allows a wide input dynamic range of the PD at a low supply voltage.

According to an aspect of the present invention, there is provided a power detector (PD) including a PD module including a first stage, a second stage, and a third stage which receive input signals and output amplified output signals and having a structure in which the first stage and the second stage are connected in parallel and an output of the second stage is input to the third stage; a filter having a terminal which is connected to an output of the third stage and receives the output signal from the third stage and the other terminal which is connected to an output terminal and generates a driving signal for a specific band among the output signals; and a calibration module having a terminal which is connected to an output terminal of the filter and receives the driving signal from the filter and the other terminal which is connected to an input terminal of the PD module and feeds back a calibration signal obtained by calibrating the driving signal to the PD module, wherein the PD module is connected to an output of the calibration module, receives and amplifies the calibration signal, and then inputs the amplified calibration signal to the first stage.

As described below, according to embodiments of the present invention, a power detector (PD) can perform calibration to minimize errors caused by a process variation and a temperature variation in a structure in which allows a wide input dynamic range of the PD at a low supply voltage.

According to the embodiments of the present invention, since the PD has a structure that can be used even at a low voltage and a high frequency, a PD in which a constant value is maintained even in a process variation and a temperature variation and errors are minimized can be designed.

According to the embodiments of the present invention, a variation with respect to the environment can be minimized while the PD has a wide input dynamic range at a low supply voltage by performing calibration on errors caused by the process variation and the temperature variation, which is a disadvantage of the PD.

BRIEF DESCRIPTION OF THE DRAWINGS

FIGS. 6A to 6D are graphs illustrating comparison results of a PD according to one embodiment of the present invention before and after calibration.

DETAILED DESCRIPTION OF THE PREFERRED EMBODIMENTS

Hereinafter, embodiments of the present invention will be described in detail with reference to the accompanying drawings.

Figure 1:
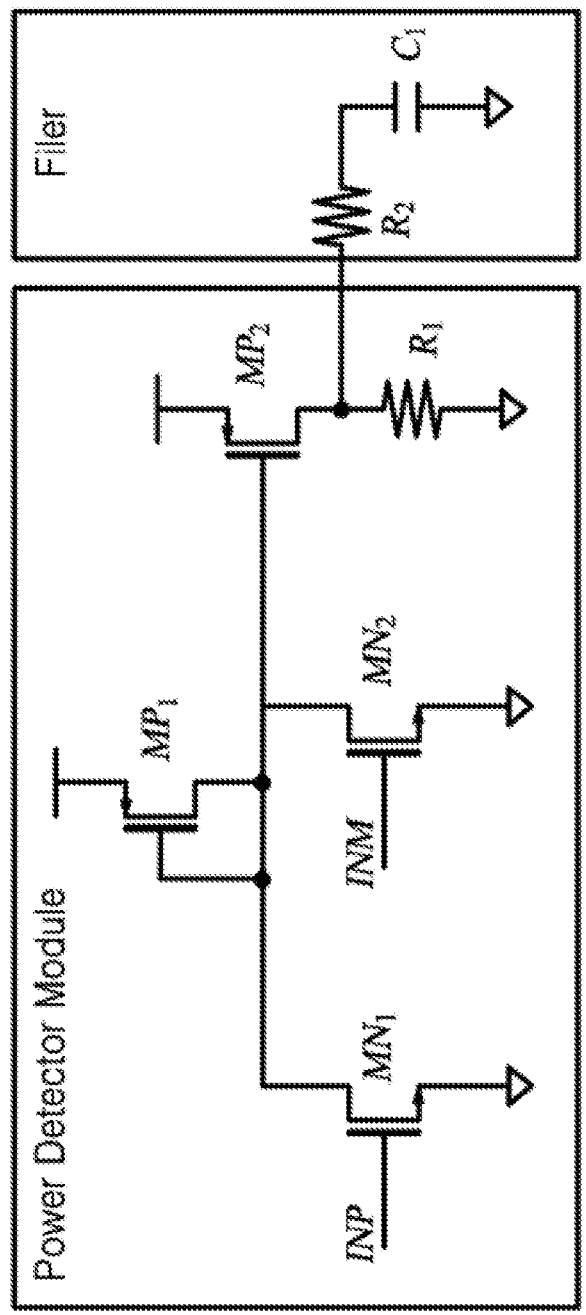
FIG. 1 is a diagram illustrating a conventional power detector (PD).
Figure 2:
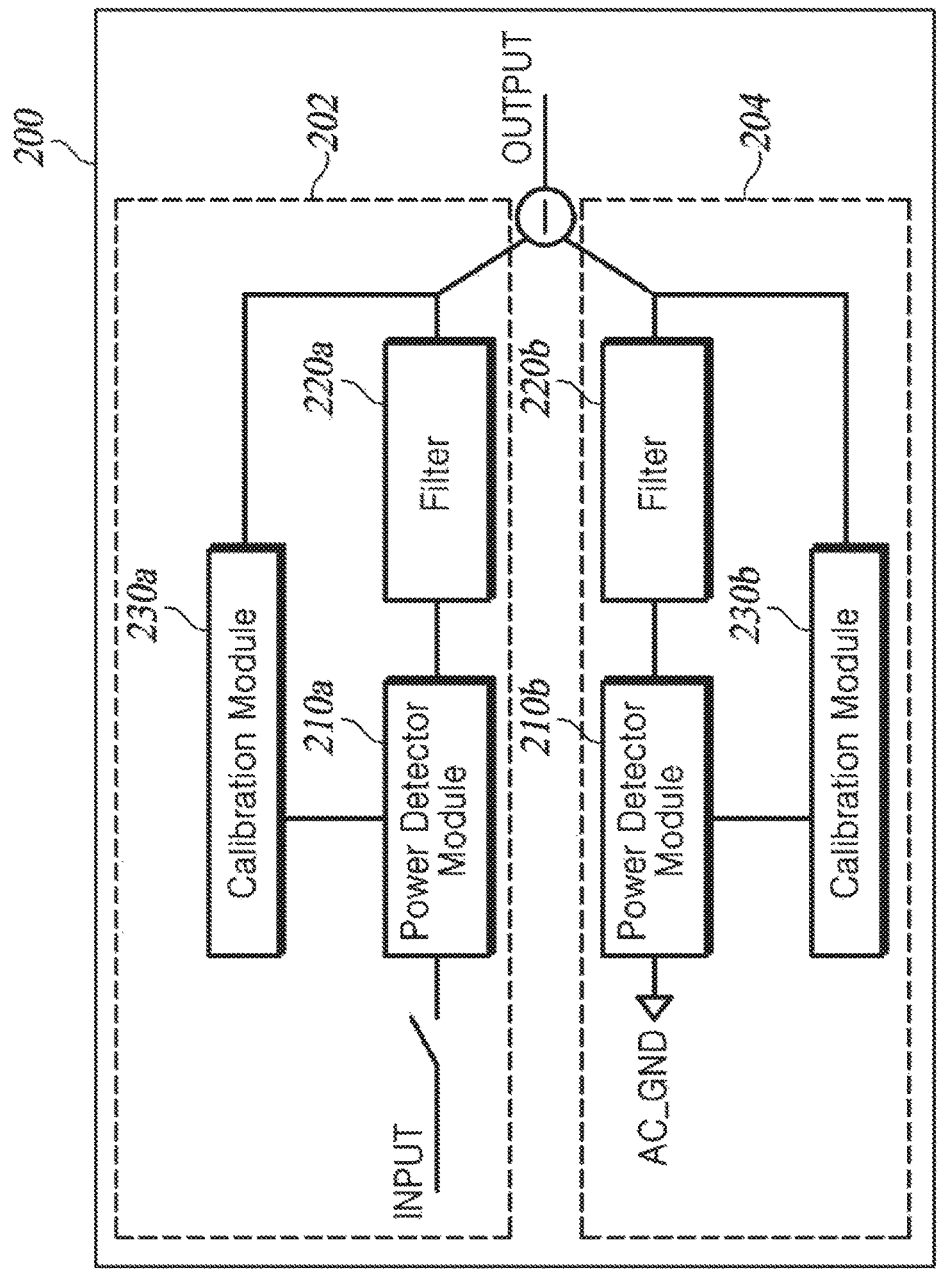
FIG. 2 is a block diagram schematically illustrating a PD according to one embodiment of the present invention.

FIG. 2 is a block diagram schematically illustrating a power detector (PD) according to one embodiment of the present invention.

The PD 200 according to the present embodiment includes a power level determiner 202 and a signal determiner 204, in which PD modules 210a and 210b, filters 220a and 220b, and calibration modules 230a and 230b are each implemented as a pair. Components included in the PD 200 are not limited thereto.

The power level determiner 202 determines a power level of an input signal in real time. The power level determiner 202 includes a first PD module 210a, a first filter 220a, and a first calibration module 230a.

A terminal of the first PD module 210a is connected to an input terminal and the other terminal of the first PD module 210a is connected to the first filter 220a. A terminal of the first filter 220a is connected to an output of the first PD module 210a and the other terminal of the first filter 220a is connected to each of the first calibration module 230a and an output terminal. A terminal of the first calibration module 230a is connected to an output of the first filter 220a and the other terminal of the first calibration module 230a is connected to an input terminal of the first PD module 210a.

The signal determiner 204 determines a state when there is no input signal by processing an input signal to an alternating current (AC) ground. The signal determiner 204 includes a second PD module 210b, a second filter 220b, and a second calibration module 230b.

A terminal of the second PD module 210b is connected to an AC ground AC_GND and the other terminal of the second PD module 210b is connected to the second filter 220b. A terminal of the second filter 220b is connected to an output of the second PD module 210b and the other terminal of the second filter 220b is connected to each of the second calibration module 230b and the output terminal. A terminal of the second calibration module 230b is connected to an output of the second filter 220b and the other terminal of the second calibration module 230b is connected to an input terminal of the second PD module 210b.

FIG. 2 is a block diagram of the PD 200 according to the present embodiment and illustrates circuits in which errors caused by a temperature variation are calibrated using a difference between the pair of PD modules 210a and 210b. A structure of the PD 200 illustrated in FIG. 2 is optimized to minimize errors caused by a process variation and a temperature variation by calibrating the errors. The PD 200 according to the present embodiment has circuits for removing a high frequency other than a DC value of a PD output value PD_OUT by respectively connecting the filters 220a and 220b to outputs of the pair of PD modules 210a and 210b and the pair of calibration modules 230a and 230b. The filters 220a and 220b are low pass filters, and errors caused by temperature that can be changed in real time in two circuits are canceled by outputting a difference between signals passing through the filters 220a and 220b as a final output value. The circuits of the PD include the power level determiner 202 which determines a power level of an input in real time and the signal determiner 204 which indicates a state when there is no signal by processing the input to the AC ground.

Errors caused by a temperature variation may be calibrated using a difference between two output nodes of the power level determiner 202 and the signal determiner 204. However, the errors caused by the process variation of the PD are not calibrated only by the difference between the output nodes of the power level determiner 202 and the signal determiner 204. Errors caused by a process variation are calibrated by an algorithm using the calibration modules 230a and 230b before the PD is used. Since calibration may be accurately performed by removing a signal which is input when the calibration is performed, a switch SW (322) is added to each of the filters 220a and 220b.

The power level determiner 202 and the signal determiner 204 may also calibrate the errors caused by the process variation by performing calibration on two output values to be equal to each other in a state in which two inputs of the PD modules 210a and 210b are AC grounded.

Figure 3:
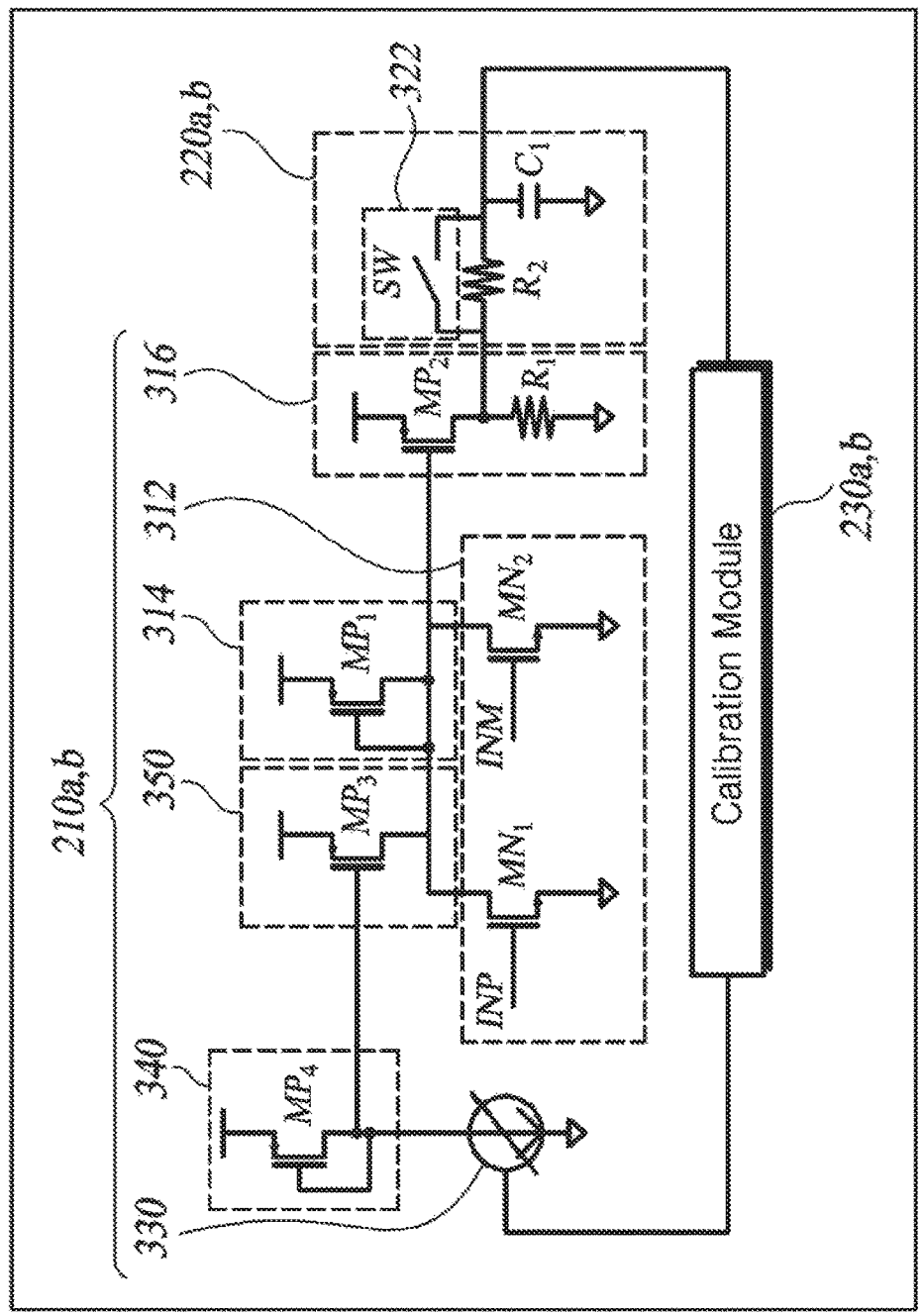
FIG. 3 is a circuit diagram illustrating a PD according to one embodiment of the present invention, which performs calibration.

FIG. 3 is a circuit diagram illustrating a PD according to one embodiment of the present invention, which performs calibration.

The PD 200 according to the present embodiment is a detector that can be used in a range from several kHz to several GHz, and includes PD modules 210a and 210b, filters 220a and 220b, and calibration modules 230a and 230b. Components included in the PD 200 are not limited thereto.

A terminal of each of the PD modules 210a and 210b is connected to an input terminal and each of the calibration modules 230a and 230b and the other terminal of each of the PD modules 210a and 210b is connected to each of the filters 220a and 220b. A terminal (the input terminal) of each of the PD modules 210a and 210b is connected to an output of each of the calibration modules 230a and 230b and receives and amplifies a calibration signal output from each of the calibration modules 230a and 230b.

Each of the PD modules 210a and 210b includes a first stage 312, a second stage 314, a third stage 316, a current source 330, a fourth P-type amplifier $MP_4$ (340), and a third P-type amplifier $MP_3$ (350).

Each of the first, second, and third stages 312, 314, and 316 outputs an output signal obtained by receiving and amplifying an input signal. The first stage 312 and the second stage 314 are connected in parallel, and an output of the second stage 314 is input to the third stage 316.

The first stage 312 includes a first N-type amplifier $MN_1$ and a second N-type amplifier $MN_2$. The first N-type amplifier $MN_1$ and the second N-type amplifier $MN_2$ of the first stage 312 are connected in parallel. In FIG. 2, although the first stage 312 is illustrated as including only the first N-type amplifier $MN_1$ and the second N-type amplifier $MN_2$, the first stage 312 may be implemented to have a structure including a plurality of amplifiers in an actual implementation of the invention.

The second stage 314 includes a first P-type amplifier $MP_1$. In the second stage 314, a terminal of the first P-type amplifier MP$_1$ is connected to a contact point of the first N-type amplifier MN$_1$ and the second N-type amplifier MN$_2$, and another terminal thereof is connected to a power source. The first P-type amplifier MP$_1$ includes a first P-type input terminal, a first P-type current inlet terminal, and a first P-type current outlet terminal. The first P-type input terminal is connected to the power source. The first P-type current inlet terminal and the first P-type current outlet terminal are connected to the contact point of the first N-type amplifier MN$_1$ and the second N-type amplifier MN$_2$. The first P-type current outlet terminal is fed back to the first P-type current inlet terminal. The second stage 314 may also be implemented to have a structure including a plurality of amplifiers.

The third stage 316 includes a second P-type amplifier MP$_2$ and a first resistor R$_1$. In the third stage 316, the second P-type amplifier MP$_2$ and the first resistor R$_1$ are connected in series, and the output of the second stage 314 is connected to a contact point of the second P-type amplifier MP$_2$ and the first resistor R$_1$.

The current source 330 receives the output of each of the calibration modules 230a and 230b. The current source 330 and the fourth P-type amplifier MP$_4$ (340) are connected in series, and an output of the fourth P-type amplifier MP$_4$ (340) is input to the third P-type amplifier MP$_3$ (350).

The fourth P-type amplifier MP$_4$ (340) includes a fourth P-type input terminal, a fourth P-type current inlet terminal, and a fourth P-type current outlet terminal. The fourth P-type input terminal is connected to the power source, and the fourth P-type current inlet terminal and the fourth P-type current outlet terminal are connected to the current source 330.

The third P-type amplifier MP$_3$ (350) includes a third P-type input terminal, a third P-type current inlet terminal, and a third P-type current outlet terminal. The third P-type input terminal is connected to a contact point of the fourth P-type amplifier MP$_4$ (340) and the current source 330. The third P-type current inlet terminal is connected to the power source, and the third P-type current outlet terminal is connected to the contact point of the first N-type amplifier MN$_1$ and the second N-type amplifier MN$_2$ which are included in the first stage 312.

A terminal of each of the filters 220a and 220b is connected to each of the PD modules 210a and 210b, and each of the other terminals thereof are respectively connected to each of the calibration modules 230a and 230b and an output terminal. The filters 220a and 220b generate driving signals for a specific band among output signals received from the PD modules 210a and 210b, and transfers the driving signals to the calibration modules 230a and 230b.

A terminal of each of the filters 220a and 220b is connected to an output of the third stage 316 of each of the PD modules 210a and 210b and receives the output signal from the third stage 316. The other terminals of each of the filters 220a and 220b are respectively connected to each of the calibration modules 230a and 230b and the output terminal, and transfer the driving signals thereto.

Each of the filters 220a and 220b includes a second resistor R$_2$, a first capacitor C$_1$, and a switch SW. The second resistor R$_2$ and the first capacitor C$_1$ are connected in series, and the switch SW is connected in parallel to the second resistor R$_2$. When the calibration modules 230a and 230b calibrate the driving signals according to preset conditions, the filters 220a and 220b switch the switch SW (322) on through the control of the calibration module 230a and 230b to make a rising time and a falling time be as short as possible.

The calibration modules 230a and 230b are digital calibration blocks and calibrate the driving signals received from the filters 220a and 220b according to the preset conditions. A process of determining preset conditions in the calibration modules 230a and 230b will be described in detail with reference to FIGS. 5A, 5B, and 5C. When the calibration modules 230a and 230b calibrate the driving signals, the calibration modules 230a and 230b transmit a control command to the filters 220a and 220b and switch the switch SW (322) on to make a rising time and a falling time be as short as possible. A terminal of each of the calibration modules 230a and 230b is connected to an output terminal of each of the filters 220a and 220b and receives the driving signal from each of the filters 220a and 220b. The other terminal of each of the calibration modules 230a and 230b is connected to an input terminal of each of the PD modules 210a and 210b, and calibration signals obtained by calibrating the driving signals are fed back to the PD modules 230a and 230b.

Each of the calibration modules 230a and 230b calibrates a final code value DC_CAL based on sizes of a PD code value PD_CODE and a reference code value REF_CODE. When the PD code value PD_CODE is equal to the reference code value REF_CODE (PD_CODE=REF_CODE), each of the calibration modules 230a and 230b calibrates the final code value DC_CAL to have the same value as a preset temporary register value DC_CAL_TEMP. When the PD code value PD_CODE is less than the reference code value REF_CODE (PD_CODE<REF_CODE) and the preset temporary register value DC_CAL_TEMP is not equal to 0 (DC_CAL_TEMP≠0), each of the calibration modules 230a and 230b subtracts 1 from the preset temporary register value DC_CAL_TEMP (DC_CAL_TEMP−1). When the PD code value PD_CODE is greater than or equal to the reference code value REF_CODE (PD_CODE≥REF_CODE), each of the calibration modules 230a and 230b calibrates a value DC_CAL_TEMP+1 obtained by adding 1 to the temporary register value DC_CAL_TEMP as the final code value DC_CAL. When the PD code value PD_CODE is greater than the reference code value REF_CODE (PD_CODE>REF_CODE) and the preset temporary register value DC_CAL_TEMP is not equal to a preset threshold value, each of the calibration modules 230a and 230b adds 1 to the preset temporary register value DC_CAL_TEMP (DC_CAL_TEMP+1). When the PD code value PD_CODE is less than or equal to the reference code value REF_CODE (PD_CODE≤REF_CODE), each of the calibration modules 230a and 230b calibrates a value DC_CAL_TEMP−1 obtained by subtracting 1 from the temporary register value DC_CAL_TEMP as the final code value DC_CAL.

In a case in which it is assumed that there is no input signal, since a process variation with respect to the first resistor R$_1$ disappears when a direct current (DC) output value at the first resistor R$_1$ is constant with respect to a process variation, the PD 200 performs digital calibration so that a desired DC output value can always be output. The fourth P-type amplifier MP$_4$ (340) and the third P-type amplifier MP$_3$ (350) may control an output of the current source 330 to control the DC output value. An output value of the current source 330 supplied to the fourth P-type amplifier MP$_4$ (340) is controlled by the calibration modules 230a and 230b so that the DC output value applied to the first resistor R$_1$ is output as a preset value. The output value of the current source 330 is controlled. This is because loss of an AC signal may be minimized by controlling only an offset value of an AC current.

Figure 4:
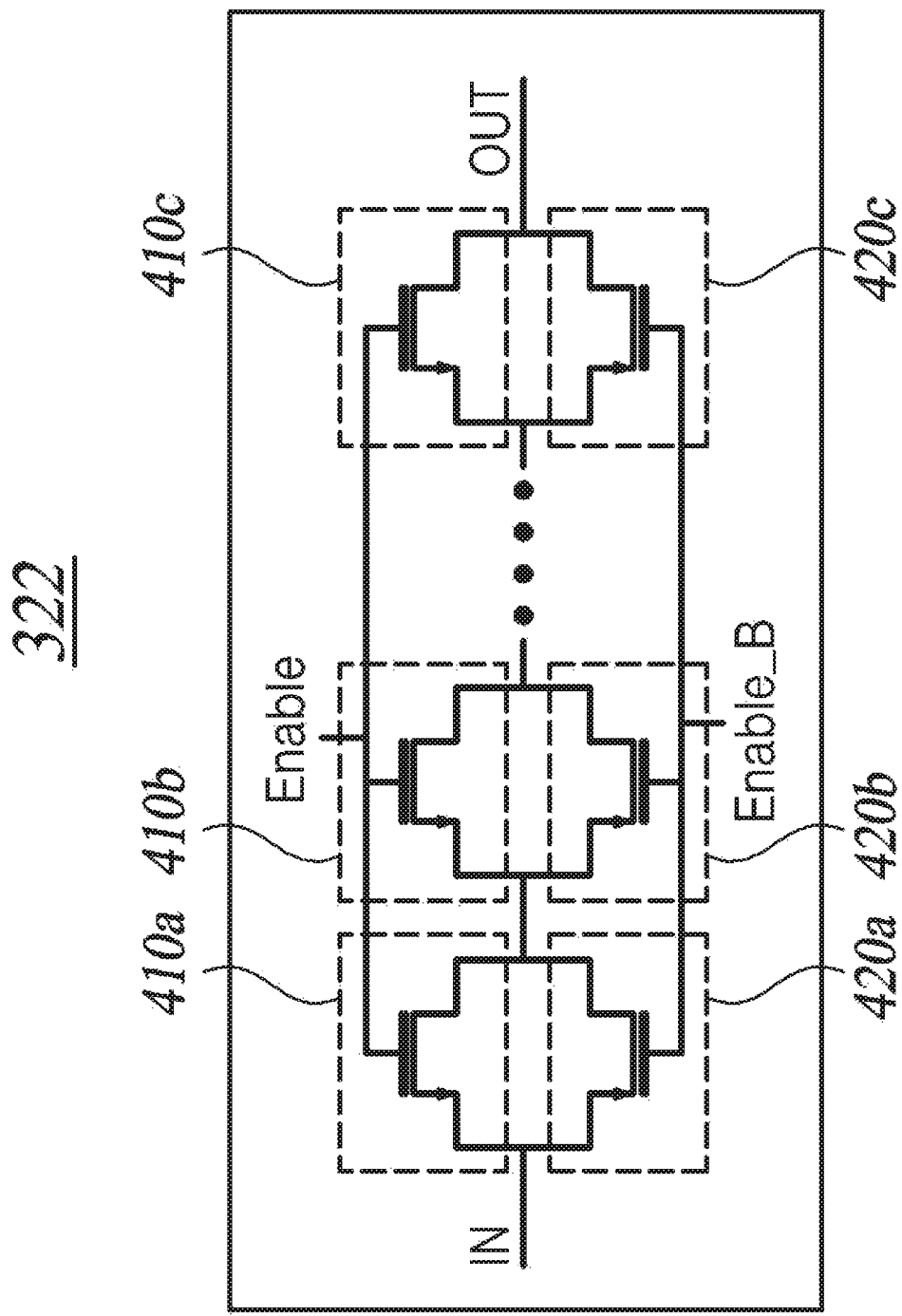
FIG. 4 is a circuit diagram illustrating a switch included in the PD according to one embodiment of the present invention, which performs the calibration.

FIG. 4 is a circuit diagram illustrating the switch included in the PD according to the present embodiment, which performs calibration.

The switch SW (322) includes a first circuit in which a plurality of N-type metal-oxide-semiconductor (NMOS) transistors 410a, 410b, and 410c are connected in series, and a second circuit in which a plurality of P-type metal-oxide-semiconductor (PMOS) transistors 420a, 420b, and 420c are connected in series. The switch SW (322) has a stack structure in which the first circuit and the second circuit are connected in parallel. Current outlet terminals of the NMOS transistors included in the switch SW (322) are respectively connected to current outlet terminals of the PMOS transistors, current inlet terminals of the NMOS transistors are respectively connected to current inlet terminals of the PMOS transistors, and input terminals of the NMOS transistors and input terminals of the PMOS transistors are each connected to the power source.

The switch SW (322) makes a value of the second resistor $R_2$ of a RC low pass filter (the filters 220a and 220b) close to zero, and is switched so that a rising time and a falling time be as short as possible when performing the digital calibration. The switch SW (322) is in an on state only when the calibration is performed by the calibration modules 230a and 230b. When a size of the second resistor $R_2$ is several MΩ, since a position of a pole for removing a high-frequency component is increased when an off resistance of the switch SW (322) is smaller than the size of the second resistor $R_2$, a plurality of MOS transistors are stacked so as to have a value sufficiently greater than a value of the second resistor $R_2$ used for the off resistance.

Figure 5A:
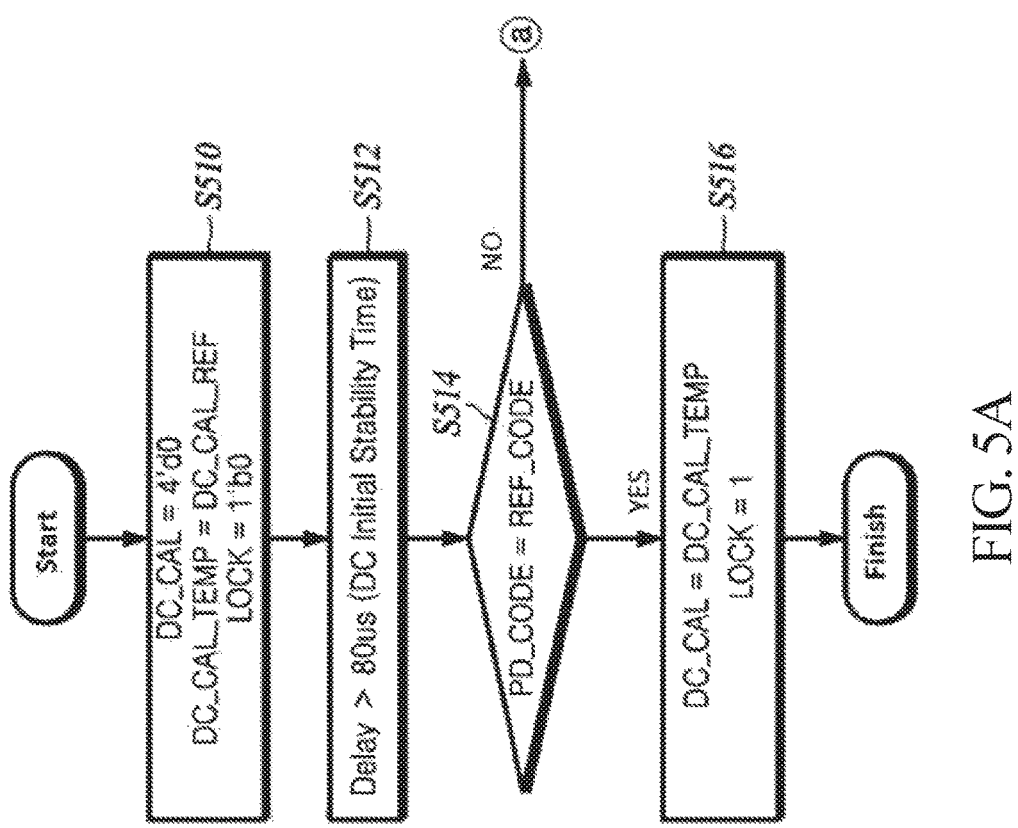
FIGS. 5A, 5B, and 5C are flowcharts for describing an algorithm which performs digital calibration according to one embodiment of the present invention.
Figure 5B:
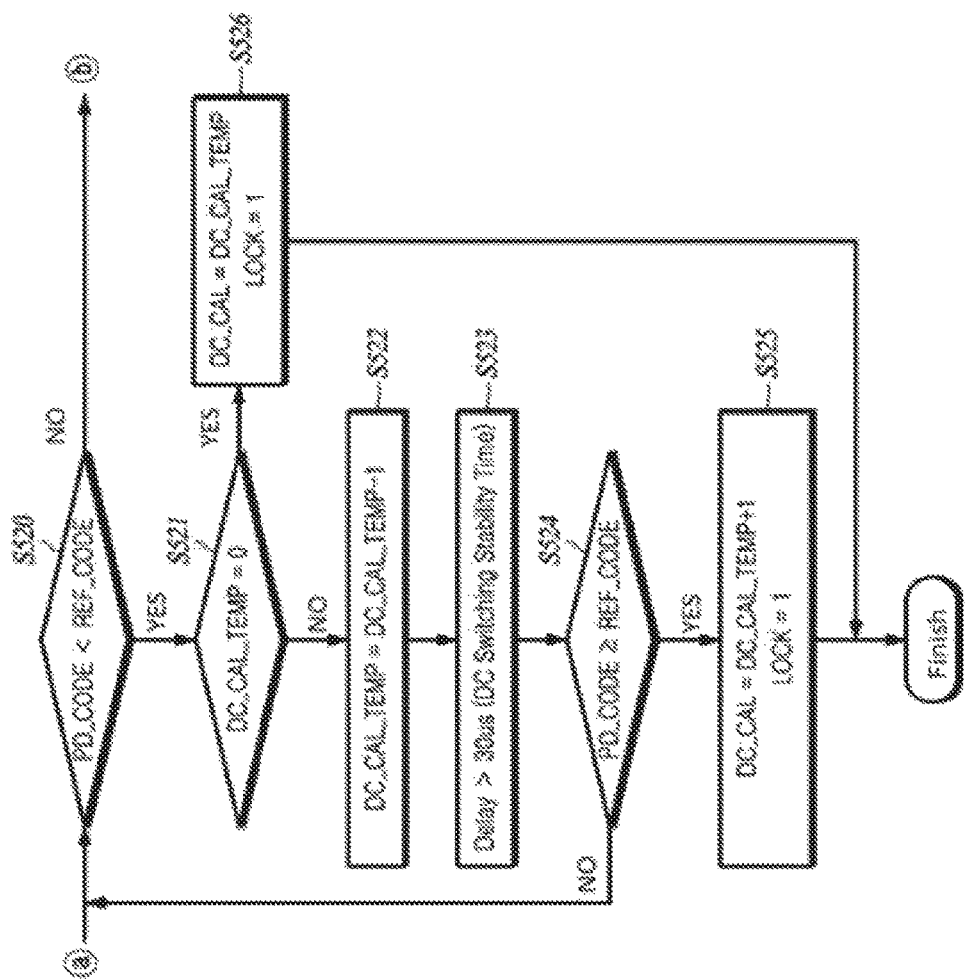
Figure 5C:
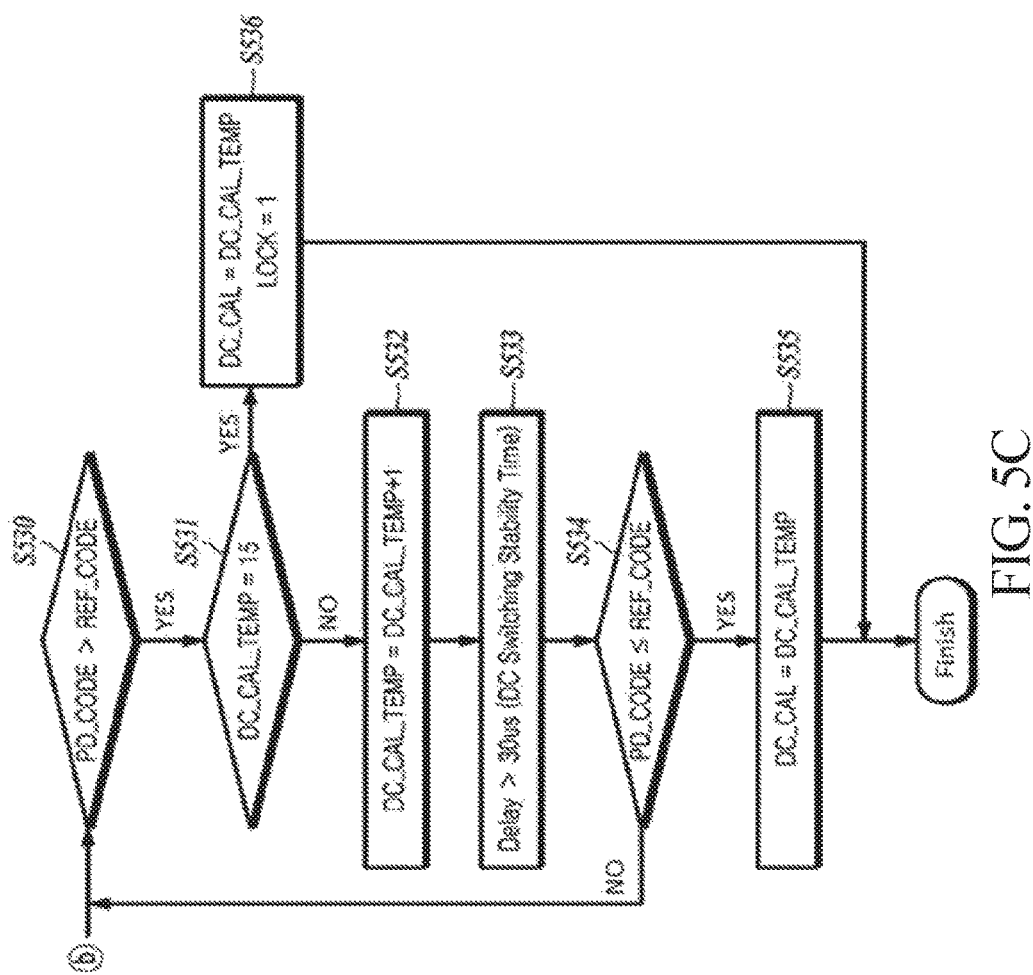

FIGS. 5A, 5B, and 5C are flowcharts for describing an algorithm which performs digital calibration according to one embodiment of the present invention.

FIGS. 5A, 5B, and 5C are flowcharts of digital calibration and illustrate an algorithm for controlling the current source 330 so that the DC output value of the first resistor $R_1$ in the PD 200 may be output as a desired set value.

First, terms illustrated in FIGS. 5A, 5B, and 5C will be described in Table 1.

TABLE 1

| Terminology | Description | Others |
| --- | --- | --- |
| DC_CAL | final code value | a final code value for controlling a current source |
| DC_CAL_TEMP | temporary register value | a temporary register value for intermediate operation to derive a final code value DC_CAL |
| DC_CAL_TEMP − 1 | temporary register value − 1 | a value obtained by subtracting 1 from a code in a register of a temporary register value DC_CAL_TEMP |
| DC_CAL_TEMP + 1 | temporary register value + 1 | a value obtained by adding 1 to a code in a register of a temporary register value DC_CAL_TEMP |
| DC_CAL_REF | start code value | a portion that sets a start code of a temporary register value DC_CAL_TEMP (since an average value is already known, it is necessary to rapidly calibrate a value near a calculated value by presetting the value) |

TABLE 1-continued

| Terminology | Description | Others |
| --- | --- | --- |
| PD_CODE | power detector (PD) code value | a PD code value |
| PD_CAL | PD calibration value | 0: reset/1: calibration start signal |
| REF_CODE | reference code value | a reference code (a value code of a direct current (DC) output voltage value targeted by a peak detector) 1: a signal indicating that calibration is completed 0: a calibrated or initialized state |

The calibration modules 230a and 230b reset and initialize each register (S510). In operation S510, the calibration modules 230a and 230b set, for example, a temporary register value DC_CAL_TEMP and the start code value DC_CAL_REF (DC_CAL_TEMP=DC_CAL_REF) to be equal to each other. The setting of 'DC_CAL_TEMP= DC_CAL_REF' is for calculating a clock as fast as possible by setting a portion corresponding to a correct value (a calculated value) to the temporary register value DC_CAL_ TEMP as a near-value. An average value may be known in advance in designing.

The calibration modules 230a and 230b wait until another analog block is stabilized (S512). In operation S512, the calibration modules 230a and 230b wait for a preset time (e.g., 80 us) until another analog block is stabilized.

The calibration modules 230a and 230b determine whether the PD code value PD_CODE is equal to the reference code value REF_CODE (PD_CODE=REF_ CODE) (S514). In operation S514, the 'PD_CODE= REF_ CODE' is a conditional statement for a calculation algorithm loop when a desired value is found immediately at the start of the calibration.

When it is determined in operation S514 that the PD code value PD_CODE is equal to the reference code value REF_CODE (PD_CODE=REF_CODE), the calibration modules 230a and 230b presume that the desired final code value DC_CAL is found, finally store the temporary register value DC_CAL_TEMP as the final code value DC_CAL in the registers, and terminate the calibration (S516). When it is determined in operation S514 that the PD code value PD_CODE is not equal to the reference code value REF_ CODE (PD_CODE≠REF_CODE), the calibration modules 230a and 230b perform operation S520.

When it is determined in operation S514 that the PD code value PD_CODE is not equal to the reference code value REF_CODE (PD_CODE≠REF_CODE), the calibration modules 230a and 230b determine whether the reference code value REF_CODE is greater than the PD code value PD_CODE (PD_CODE<REF_CODE) (S520). Operation S520 is a conditional statement for a calculation algorithm loop when a value is less than a desired value at the start of the calibration in the calibration modules 230a and 230b. The calibration modules 230a and 230b perform operation S530 when it is determined that the PD code value PD_CODE is greater than the reference code value REF_ CODE in operation S520.

When it is determined in operation S520 that the reference code value REF_CODE is greater than the PD code value PD_CODE (PD_CODE<REF_CODE), the calibration modules 230a and 230b determine whether the temporary register value DC_CAL_TEMP is equal to 0 (DC_CA-L_TEMP=0) (S521).

When it is determined in operation S521 that the temporary register value DC_CAL_TEMP is equal to 0 (DC_CAL_TEMP=0), the calibration modules 230a and 230b set the temporary register value DC_CAL_TEMP and the final code value DC_CAL to 0 and then terminate the calibration (S526). In operation S526, when the calibration modules 230a and 230b do not find the final code value DC_CAL even though the temporary register value DC_CAL_TEMP is 0, the calibration modules 230a and 230b store the final code value DC_CAL as 0 and terminate the calibration.

When it is determined in operation S521 that the temporary register value DC_CAL_TEMP is not equal to 0 (DC_CAL_TEMP≠0), the calibration modules 230a and 230b set a value DC_CAL_TEMP−1 obtained by subtracting 1 from the temporary register value DC_CAL_TEMP as the temporary register value DC_CAL_TEMP (S522). The calibration modules 230a and 230b wait until another analog block on the circuit is stabilized (S523). In operation S523, the calibration modules 230a and 230b wait for a preset time (e.g., 30 us) until another analog block on the circuit is stabilized.

The calibration modules 230a and 230b determine whether the PD code value PD_CODE is greater than or equal to the reference code value REF_CODE (PD_CODE≥REF_CODE) (S524).

When it is determined in operation S524 that the PD code value PD_CODE is greater than or equal to the reference code value REF_CODE (PD_CODE≥REF_CODE), the calibration modules 230a and 230b set a value DC_CAL_TEMP+1 obtained by adding 1 to the temporary register value DC_CAL_TEMP as the temporary register value DC_CAL_TEMP and then terminate the calibration (S525). In operation S525, the calibration modules 230a and 230b presume that the desired final code value DC_CAL is found when the PD code value PD_CODE is greater than or equal to the reference code value REF_CODE (PD_CODE≥REF_CODE), finally store the temporary register value DC_CAL_TEMP as the final code value DC_CAL, and terminate the calibration. When it is determined in operation S524 that the PD code value PD_CODE is less than the reference code value REF_CODE (PD_CODE<REF_CODE), the process returns to operation S520 and the calibration modules 230a and 230b repeat operations S520 to S522 to find the final code value DC_CAL while decreasing the code by 1.

Meanwhile, when it is determined in operation S520 that the reference code value REF_CODE is less than or equal to the PD code value PD_CODE (PD_CODE≥REF_CODE), the calibration modules 230a and 230b determine whether the PD code value PD_CODE is greater than the reference code value REF_CODE (S530). Operation S530 is a conditional statement for a calculation algorithm loop when a value is greater than a desired value at the start of the calibration in the calibration modules 230a and 230b.

When it is determined in operation S530 that the reference code value REF_CODE is greater than the PD code value PD_CODE (PD_CODE<REF_CODE), the calibration modules 230a and 230b determine whether the temporary register value DC_CAL_TEMP is equal to 15 (DC_CAL_TEMP=15) (S531). When it is determined in operation S531 that the temporary register value DC_CAL_TEMP is equal to 15, the calibration modules 230a and 230b set the temporary register value DC_CAL_TEMP and the final code value DC_CAL to 15 and terminate the calibration (S536). In operation S536, when the calibration modules 230a and 230b do not find the final code value DC_CAL even though the temporary register value DC_CAL_TEMP is set to 15, the calibration modules 230a and 230b store the calculated value as a value of the final code value (DC_CAL=15) and terminate the calibration. In operations S531 and S536, the calibration modules 230a and 230b set the value of 15 using, for example, '4 Bit.'

When it is determined in operation S531 that the temporary register value DC_CAL_TEMP is not equal to 15 (DC_CAL_TEMP≠15), the calibration modules 230a and 230b set a value DC_CAL_TEMP+1 obtained by adding 1 to the temporary register value DC_CAL_TEMP as the temporary register value DC_CAL_TEMP (S532).

The calibration modules 230a and 230b wait until another analog block on the circuit is stabilized (S533). In operation S533, the calibration modules 230a and 230b wait for a preset time (e.g., 30 us) until another analog block on the circuit is stabilized.

The calibration modules 230a and 230b determine whether the PD code value PD_CODE is less than or equal to the reference code value REF_CODE (PD_CODE≤REF_CODE) (S534). When it is determined in operation S534 that the PD code value PD_CODE is less than or equal to the reference code value REF_CODE, the calibration modules 230a and 230b set a value DC_CAL_TEMP+1 obtained by adding 1 to the temporary register value and the temporary register value DC_CAL_TEMP to be equal to each other, and then terminate the calibration (S535). In operation S535, when the PD code value PD_CODE is less than or equal to the reference code value REF_CODE (PD_CODE≤REF_CODE), the calibration modules 230a and 230b presume that the desired final code value DC_CAL is found, finally store the temporary register value DC_CAL_TEMP as the final code value DC_CAL, and terminate the calibration. When it is determined in operation S534 that the PD code value PD_CODE is greater than the reference code value REF_CODE (PD_CODE>REF_CODE), the process returns to operation S530 and the calibration modules 230a and 230b repeat operations S530 to S532 to find the final code value DC_CAL while increasing the code by 1.

In FIGS. 5A, 5B, and 5C, operations S510 to S535 are described as being sequentially performed, but the present invention is not limited thereto. In other words, since operations described in FIGS. 5A, 5B, and 5C may be changed and performed or one or more operations therein may be performed in parallel, the operations described in FIGS. 5A, 5B, and 5C are not limited to being performed in chronological order.

As described above, the algorithm for performing the digital calibration according to the present embodiment described in FIGS. 5A, 5B, and 5C may be implemented as a program and may be stored in a computer readable medium. The computer readable medium in which the program for implementing the algorithm for performing the digital calibration according to the present embodiment is stored includes all types of recording media in which data that can be read by a computer system is stored.

FIGS. 6A to 6D are graphs illustrating comparison results of a PD according to one embodiment of the present invention before and after calibration.

FIGS. 6A to 6D are graphs illustrating a PD output value PD_OUT before calibration and a PD output value PD_OUT_CAL after the calibration according to a temperature variation and a process variation.

FIGS. 6A and 6C which are graphs illustrated at a left side thereof respectively illustrate data values PD_OUT before the calibration. FIGS. 6B and 6D which are graphs illustrated at a right side thereof respectively illustrate data values PD_OUT_CAL after the calibration. Comparing FIG. 6A and FIG. 6C (PD_OUT vs PD_OUT_CAL) and FIG. 6B and FIG. 6D (PD_OUT vs PD_OUT_CAL), it can be confirmed that there has been almost no variation since the calibration.

While the present invention has been particularly described with reference to exemplary embodiments, it will be understood by those of skilled in the art that various changes in form and details may be made without departing from the spirit and scope of the present invention. Therefore, the exemplary embodiments should be considered in a descriptive sense only and not for purposes of limitation. The scope of the invention is defined not by the detailed description of the invention but by the appended claims, and encompasses all modifications and equivalents that fall within the scope of the appended claims.

What is claimed is:

1. A power detector (PD) comprising:
    a PD module including a first stage, a second stage, and a third stage which receive input signals and output amplified output signals and having a structure in which the first stage and the second stage are connected in parallel and an output of the second stage is input to the third stage;
    a filter having a first terminal which is connected to an output of the third stage and receives the output signal from the third stage and a second terminal which is connected to an output terminal and generates a driving signal for a specific band among the output signals; and
    a calibration module having a third terminal which is connected to an output terminal of the filter and receives the driving signal from the filter and a fourth terminal which is connected to an input terminal of the PD module and feeds back a calibration signal obtained by calibrating the driving signal to the PD module,
    wherein the PD module is connected to an output of the calibration module, receives and amplifies the calibration signal, and then inputs the amplified calibration signal to the first stage, and
    wherein the calibration module calibrates a final code value based on sizes of a PD code value and a reference code value.

2. The PD of claim 1, wherein:
    the filter includes a second resistor, a first capacitor, and a switch, wherein the second resistor and the first capacitor are connected in series and the switch is connected in parallel to the second resistor; and
    when the calibration module calibrates the driving signal according to a preset condition, the calibration module switches the switch on through control of the calibration module and makes a rising time and a falling time be as short as possible.

3. The PD of claim 2, wherein the switch includes a first circuit in which a plurality of N-type metal-oxide-semiconductor (NMOS) transistors are connected in series and a second circuit in which a plurality of P-type metal-oxide-semiconductor (PMOS) transistors are connected in series, and has a stack structure in which the first circuit and the second circuit are connected in parallel.

4. The PD of claim 3, wherein, in the switch, current outlet terminals of the NMOS transistors are respectively connected to current outlet terminals of the PMOS transistors, current inlet terminals of the NMOS transistors are respectively connected to current inlet terminals of the PMOS transistors, and input terminals of the NMOS transistors and input terminals of the PMOS transistors are connected to a power source.

5. The PD of claim 1, wherein the PD module includes a third P-type amplifier, a fourth P-type amplifier, and a current source, wherein the current source receives an output of the calibration module, the current source and the fourth P-type amplifier are connected in series, and an output of the fourth P-type amplifier is input to the third P-type amplifier.

6. The PD of claim 5, wherein the third P-type amplifier includes a third P-type input terminal, a third P-type current inlet terminal, and a third P-type current outlet terminal, wherein the third P-type input terminal is connected to a contact point of the fourth P-type amplifier and the current source, the third P-type current inlet terminal is connected to a power source, and the third P-type current outlet terminal is connected to a contact point of the first N-type amplifier and the second N-type amplifier included in the first stage.

7. The PD of claim 5, wherein the fourth P-type amplifier includes a fourth P-type input terminal, a fourth P-type current inlet terminal, and a fourth P-type current outlet terminal, wherein the fourth P-type input terminal is connected to a power source, and the fourth P-type current inlet terminal and the fourth P-type current outlet terminal are connected to the current source.

8. The PD of claim 1, wherein, when the PD code value is equal to the reference code value, the calibration module calibrates the final code value to have the same value as a preset temporary register value.

9. The PD of claim 1, wherein:
    when the PD code value is less than the reference code value and a preset temporary register value is not equal to 0, the calibration module subtracts 1 from the preset temporary register value; and
    when the PD code value is greater than or equal to the reference code value, the calibration module calibrates a value obtained by adding 1 to the temporary register value as the final code value.

10. The PD of claim 1, wherein:
    when the PD code value is greater than the reference code value and a preset temporary register value is not equal to a preset threshold value, the calibration module adds 1 to the preset temporary register value; and
    when the PD code value is less than or equal to the reference code value, the calibration module calibrates a value obtained by subtracting 1 from the temporary register value as the final code value.

11. The PD of claim 1, wherein the PD module, the filter, and the calibration module are each implemented as a pair, and
    the PD further comprising:
        a power level determiner including a first PD module, a first filter, and a first calibration module among the pairs, wherein the first PD module is connected to an input terminal and determines a power level of the input signal in real time; and
        a signal determiner including a second PD module, a second filter, and a second calibration module among the pairs, wherein the second PD module is connected to an alternating current (AC) ground, processes the input signal to the AC ground, and determines a state in which there is no input signal.

12. The PD of claim 11, wherein, in the power level determiner, a terminal of the first PD module is connected to the input terminal, the other terminal of the first PD module is connected to the first filter, a terminal of the first filter is connected to an output of the first PD module, the other terminal of the first filter is connected to each of the first calibration module and an output terminal, a terminal of the first calibration module is connected to an output of the first filter, the other terminal of the first calibration module is connected to an input terminal of the first PD module, and the power level of the input signal is determined in real time.

13. The PD of claim 11, wherein, in the signal determiner, a terminal of the second PD module is connected to the AC ground, the other terminal of the second PD module is connected to the second filter, a terminal of the second filter is connected to an output of the second PD module, the other terminal of the second filter is connected to each of the second calibration module and an output terminal, a terminal of the second calibration module is connected to an output of the second filter, the other terminal of the second calibration module is connected to an input terminal of the second PD module, and the input signal is removed.

* * * * *